US008299516B2

(12) United States Patent
Weng et al.

(10) Patent No.: US 8,299,516 B2
(45) Date of Patent: Oct. 30, 2012

(54) VERTICAL THIN FILM TRANSISTOR AND METHOD FOR MANUFACTURING THE SAME AND DISPLAY DEVICE INCLUDING THE VERTICAL THIN FILM TRANSISTOR AND METHOD FOR MANUFACTURING THE SAME

(75) Inventors: Shou-cheng Weng, Changhua (TW); Huai-an Li, Zhongli (TW); Chi-neng Mo, Zhongli (TW)

(73) Assignee: Chunghwa Picture Tubes, Ltd., Bade City, Taoyuan (TW)

( * ) Notice: Subject to any disclaimer, the term of this patent is extended or adjusted under 35 U.S.C. 154(b) by 315 days.

(21) Appl. No.: 12/697,303

(22) Filed: Feb. 1, 2010

(65) Prior Publication Data

US 2011/0108909 A1    May 12, 2011

(30) Foreign Application Priority Data

Nov. 6, 2009  (TW) ................ 98137856 A

(51) Int. Cl.
*H01L 27/108*  (2006.01)
(52) U.S. Cl. ......... 257/302; 257/E29.274; 257/E29.275; 257/E21.41; 257/E27.057; 257/E27.096; 257/329; 257/E29.118; 257/E29.262; 257/E29.273
(58) Field of Classification Search ........... 257/302, 257/329, E29.118, E29.262, E29.273–E29.275, 257/E21.41, E27.057, E27.096
See application file for complete search history.

(56) References Cited

U.S. PATENT DOCUMENTS

| 2006/0125025 A1* | 6/2006 | Kawashima et al. ......... 257/401 |
| 2007/0008773 A1* | 1/2007 | Scheuerlein .................. 365/161 |
| 2007/0138527 A1* | 6/2007 | Daley et al. .................. 257/296 |
| 2008/0014686 A1* | 1/2008 | Wang et al. .................. 438/156 |

FOREIGN PATENT DOCUMENTS

TW          508679         11/2002

OTHER PUBLICATIONS

Kiyoshi Fujimoto, Takaaki Hiroi, Kazuhiro Kudo and Masakazu Nakamura, "High-Performance, Vertical-Type Organic Transistors with Built-In Nanotriode Arrays", Advanced Materials, 2007, 19, pp. 525-530, Wiley-VCH Verlag GmbH & Co., Weinheim, Germany.

* cited by examiner

*Primary Examiner* — Julio J Maldonado
*Assistant Examiner* — Hajar Kolahdouzan
(74) *Attorney, Agent, or Firm* — Cheng-Ju Chiang

(57) ABSTRACT

A vertical thin film transistor and a method for manufacturing the same and a display device including the vertical thin film transistor and a method for manufacturing the same are disclosed. The vertical thin film transistor is applied to a substrate. In the present invention, a gate layer of the vertical thin film transistor is formed to have a plurality of concentric annular structures and the adjacent concentric annular structures are linked. By the concentric annular structures of the gate electrode layer, resistance to stress and an on-state current of the vertical thin film transistor can be increased.

17 Claims, 7 Drawing Sheets

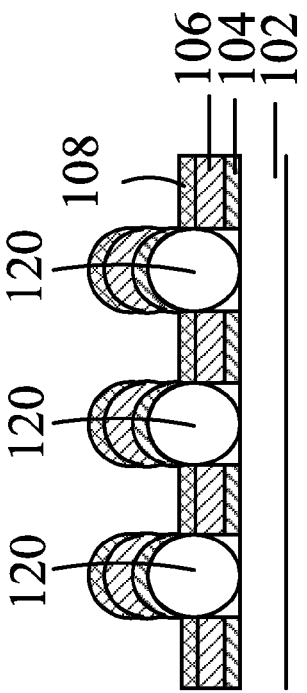
FIG. 1A (PRIOR ART)
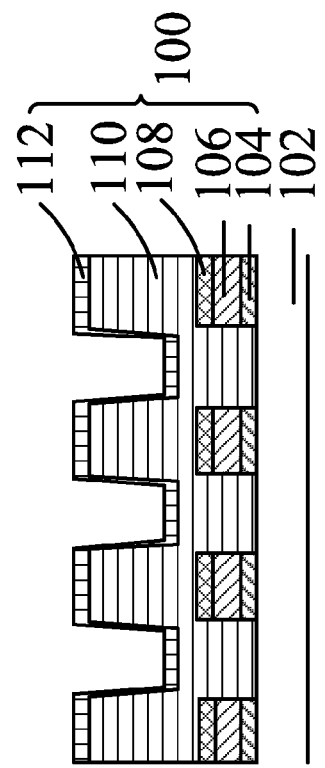
FIG. 1B (PRIOR ART)
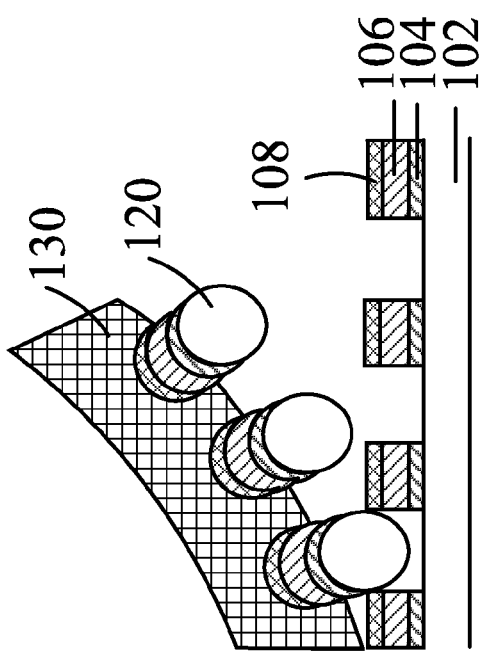
FIG. 1C (PRIOR ART)
FIG. 1D (PRIOR ART)

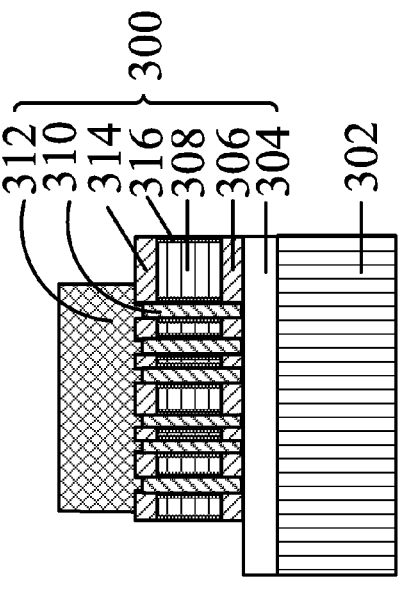
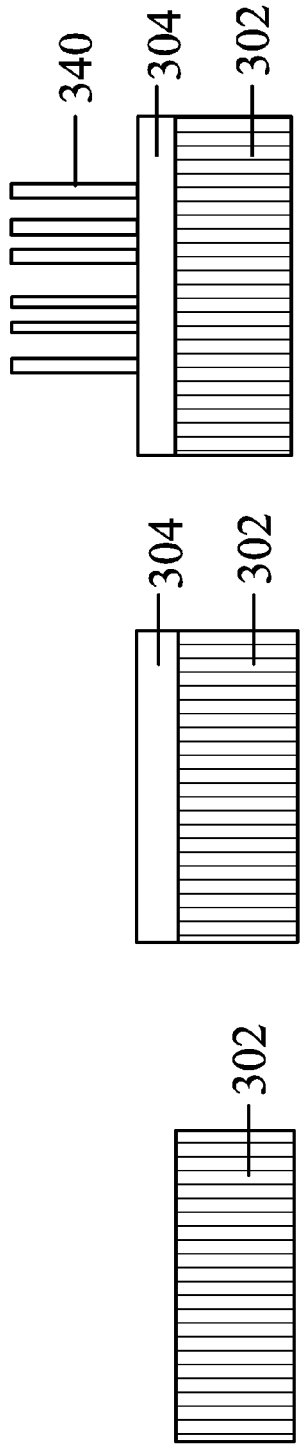
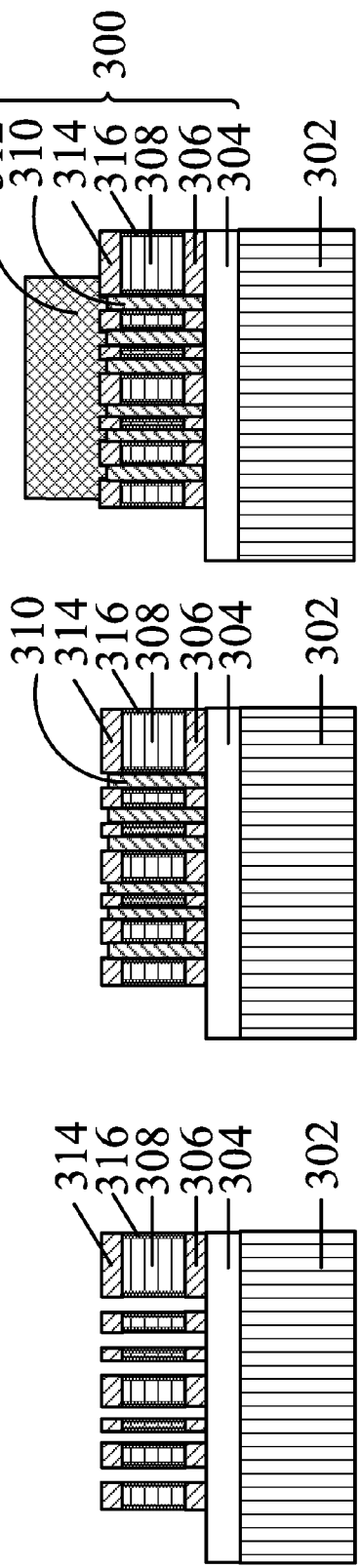

VERTICAL THIN FILM TRANSISTOR AND METHOD FOR MANUFACTURING THE SAME AND DISPLAY DEVICE INCLUDING THE VERTICAL THIN FILM TRANSISTOR AND METHOD FOR MANUFACTURING THE SAME

TECHNICAL FIELD OF THE INVENTION

The present invention relates to a vertical thin film transistor, and more particularly to a vertical thin film transistor capable of increasing resistance to stress and an on-state current and a method for manufacturing the same as well as a display device including the vertical thin film transistor and a method for manufacturing such a display device.

BACKGROUND OF THE INVENTION

An organic light emitting diode (OLED) display device has potential in development in the future. This is because a liquid crystal display (LCD) device requires a backlight module as a light source so that images can be displayed, in contrast, the organic light emitting diode display device can emit lights by itself and therefore does not require the backlight module. However, if thin film transistors (TFTs) in the organic light emitting diode display device are manufactured by a semiconductor material having a low carrier mobility, such as hydrogenated amorphous silicon (a-Si:H), current provided by the thin film transistors will be insufficient. This situation will contribute to require higher cost to design a compensating circuit.

A structure of a vertical thin film transistor has a high carrier mobility and thus the above-mentioned situation of the current insufficiency can be avoided. In the past researches and studies about the vertical thin film transistor, one famous paper was proposed by Fujimoto et al. in 2007 (Fujimoto Kiyoshi, Takaaki Hiroi, Kazuhiro Kudo, and Masakazu Nakamura, "High-Performance, Vertical-Type Organic Transistors with Built-in Nanotriode Arrays", Advanced Materials, 19, 525, 2007). Please refer to FIGS. 1A-1D. FIGS. 1A-1D illustrate a manufacturing process flow chart of the vertical thin film transistors 100 proposed in the above-mentioned paper. In FIG. 1A, numerous polystyrene particles 120 having charge with the same polarity are sprayed on a glass substrate 102. The polystyrene particles 120 are used as shutters for separating transistor elements which will be manufactured on the glass substrate 102. In theory, there is a distance between the adjacent polystyrene particles 120 because of repulsive force of the charge with the same polarity. In FIG. 1B, the polystyrene particles 120 are served as evaporation masks, and a first electrode layer 104 served as a drain layer (or a source layer), an insulating layer 106, and a gate electrode layer 108 are deposited sequentially between the adjacent polystyrene particles 120. In FIG. 1C, the polystyrene particles 120 are removed by using an adhesive tape 130. In FIG. 1D, a semiconductor layer 110 and a second electrode layer 112 served as a source layer (or a drain layer) are deposited sequentially to complete manufacturing of the vertical thin film transistors 100.

However, there are some problems in the above-mentioned manufacturing method. First, numerous amounts of the polystyrene particles 120 sprayed on different areas of the glass substrate 102 are difficult to control. Thus, the polystyrene particles 120 are usually distributed non-uniformly thereon. Accordingly, the transistor elements manufactured on the glass substrate 102 are also distributed non-uniformly. Furthermore, the distance between the adjacent polystyrene particles 120 is proportional to the quantities of charge of the adjacent polystyrene particles 120. That is, when the quantities of charge of the adjacent polystyrene particles 120 are great, the distance between the adjacent polystyrene particles 120 is long. Because the polystyrene particles 120 have different quantities of charge, the distances between the adjacent polystyrene particles 120 are also different. As a result, the transistor elements manufactured on the glass substrate 120 have different sizes, and characteristics of the transistor elements are also different, resulting in difficulty in controlling the transistor elements.

Please refer to FIG. 2. FIG. 2 illustrates a structure of the vertical thin film transistor 100 and a driving circuit thereof in the above-mentioned paper. The vertical thin film transistor 100 manufactured by the manufacturing method shown in FIGS. 1A-1D is capable of providing a sufficient current to drive organic light emitting diodes when $V_{DS}$ and $V_G$ are both low. Accordingly, the vertical thin film transistor 100 is suitable to be utilized in the organic light emitting diode display device without an extra compensating circuit. A depletion region, which is formed in a contact interface between the gate electrode layer 108 and the semiconductor layer 110, is served as an insulating layer in the vertical thin film transistor 100. However, the depletion region is very small, and therefore $V_G$ applied to the vertical thin film transistor 100 can not be too high. Other problems such as a high off-state current and a low ON/OFF current ratio of only approximately $10^3$, lead to a bad performance on switching effects of the vertical thin film transistor 100.

Therefore, there is a need for a solution to the above-mentioned problems of the vertical thin film transistor.

SUMMARY OF THE INVENTION

A primary objective of the present invention is to provide a vertical thin film transistor capable of increasing resistance to stress and an on-state current and a method for manufacturing the same as well as a display device including the vertical thin film transistor and a method for manufacturing such a display device.

The vertical thin film transistor according to the present invention is applied to a substrate and includes a first electrode layer, a first insulating layer, a gate electrode layer, a second insulating layer, a semiconductor layer, a third insulating layer, and a second electrode layer. The first electrode layer is formed on the substrate. The first electrode layer includes a first area and a second area. The first area comprises a plurality of concentric annular sub-areas and at least one linking sub-area. Each linking sub-area is positioned to link the adjacent concentric annular sub-areas. The second area has at least one sub-area, and each sub-area is positioned in a region between the adjacent concentric annular sub-areas excluding the linking sub-area of the first area. The first insulating layer is formed on the first area of the first electrode layer. The gate electrode layer is formed correspondingly on the first insulating layer. The second insulating layer is formed correspondingly on the gate electrode layer. The semiconductor layer is formed on the second area of the first electrode layer. The third insulating layer is formed on side surfaces of the gate electrode layer. The second electrode layer is formed on the semiconductor layer.

The display device according to the present invention includes the above-mentioned vertical thin film transistor.

The method for manufacturing the vertical thin film transistor according to the present invention is applied to a substrate and includes steps of: forming a first electrode layer on the substrate; forming a patterned photoresistor layer on the first electrode layer so as to make the first electrode layer comprise a first area and a second area, wherein the first area comprises a plurality of concentric annular sub-areas and at least one linking sub-area, each linking sub-area is positioned to link the adjacent concentric annular sub-areas, the second area has at least one sub-area, and each sub-area of the second area is positioned in a region between the adjacent concentric annular sub-areas excluding the linking sub-area of the first area; forming a first insulating layer on the first area of the first electrode layer; forming correspondingly a gate electrode layer on the first insulating layer; forming correspondingly a second insulating layer on the gate electrode layer; removing the patterned photoresistor layer disposed on the second area; forming a third insulting layer on side surfaces of the gate electrode layer; forming a semiconductor layer on the second area of first electrode layer; and forming a second electrode layer on the semiconductor layer.

The method for manufacturing the display device includes the above-mentioned method for manufacturing the vertical thin film transistor.

The gate layer of the present invention is formed to have a plurality of concentric annular structures so that resistance to stress of the vertical thin film transistor can be increased. The on-state current is also increased due to an increasing of a channel width (W) of the vertical thin film transistor. In addition, the semiconductor layer is almost shielded and covered by metal layers which comprise the first electrode layer, the gate layer, and the second electrode layer. Therefore, the metal layers can protect the semiconductor layer from affects of electromagnetic waves and electro-optical effects or reduce such affects at least. The metal layers also can decrease a high off-state current of the vertical thin film transistor. Finally, the formation of the third insulating layer can increase a range for applying a voltage to the gate electrode layer and the ON/OFF current ratio of the vertical thin film transistor.

BRIEF DESCRIPTION OF THE DRAWINGS

FIGS. 1A-1D illustrate a manufacturing process flow chart of the vertical thin film transistors proposed in the above-mentioned paper;

FIGS. 4A-4F illustrate steps of a flow chart of a method for manufacturing the vertical thin film transistor according to one embodiment of the present invention;

DETAILED DESCRIPTION OF THE INVENTION

Figure 3:
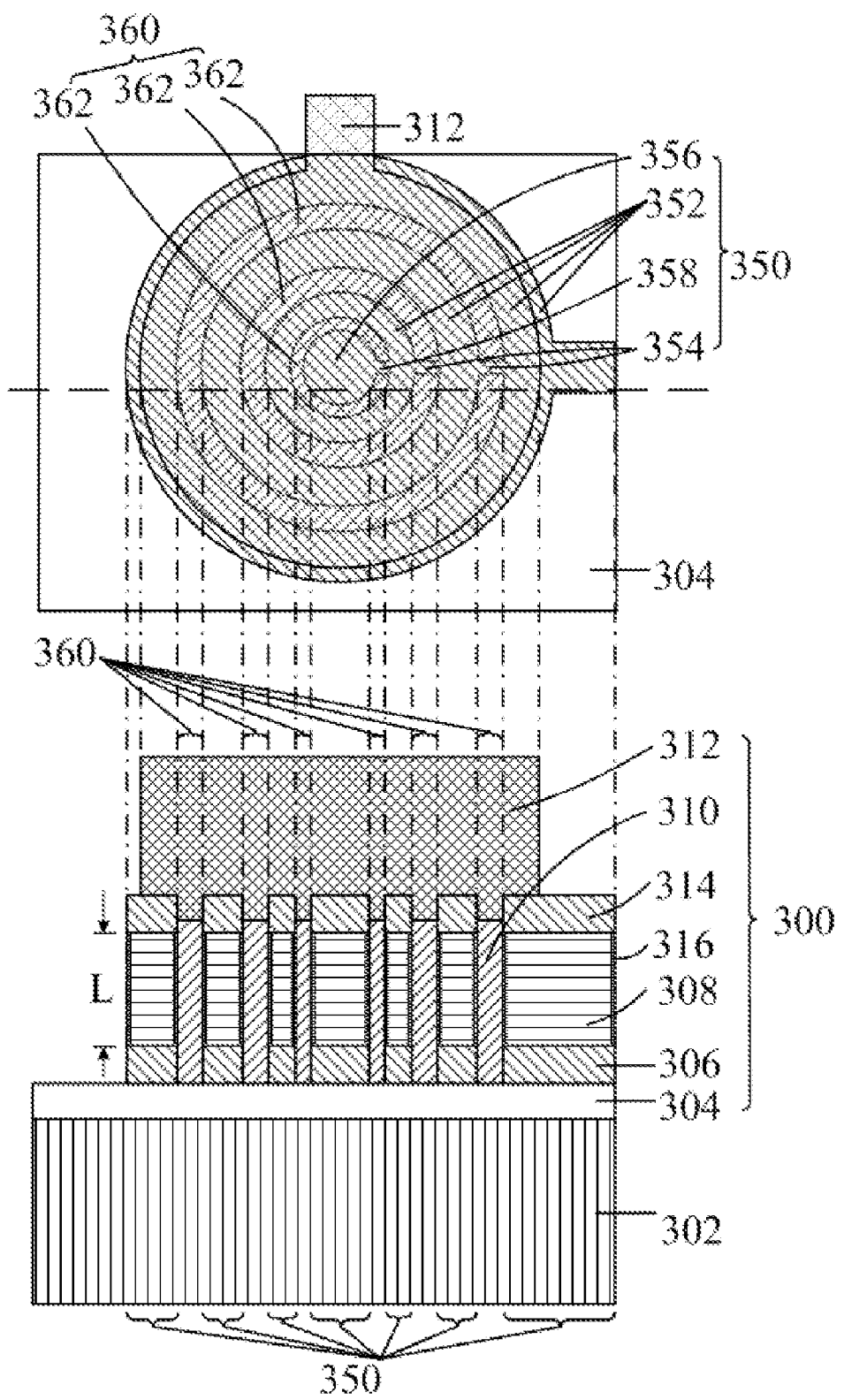
FIG. 3 illustrates a structure of a vertical thin film transistor according to an embodiment of the present invention.

Please refer to FIG. 3. FIG. 3 illustrates a structure of a vertical thin film transistor 300 according to an embodiment of the present invention. The upper part of FIG. 3 is a top view diagram, and the lower part of FIG. 3 is a side view diagram.

The vertical thin film transistor 300 is applied to a substrate 302 and includes a first electrode layer 304, a first insulating layer 306, a gate electrode layer 308, a second insulating layer 314, a semiconductor layer 310, a third insulating layer 316, and a second electrode layer 312. The feature of the present invention is that the gate electrode layer 308 is formed to have a plurality of concentric annular structures so as to increase resistance to stress of the vertical thin film transistor 300. By the concentric annular structures of the gate electrode layer 308, when the substrate 302 is bended, the semiconductor layer 310 can be protected. In addition, the present invention can increase a channel width (W) of the vertical thin film transistor 300, and thus an on-state current also can be increased. This will be described later.

The substrate 302 includes a flexible substrate or a rigid substrate. The flexible substrate is made of polyethylene terephthalate (PET) or polyimide, for example. The rigid substrate is made of glass, for example.

The first electrode layer 304 is formed on the substrate 302 and made of at least one material selected from a group consisting of aurum, aluminum, copper, chromium, molybdenum, tantalum, and indium tin oxide (ITO). The first electrode layer 304 includes a first area 350 and a second area 360. The first area 350 includes a plurality of concentric annular sub-areas 352, a plurality of linking sub-areas 354, a circular sub-area 356, and an innermost linking sub-area 358. Each linking sub-area 354 is positioned to link the adjacent concentric annular sub-areas 352. The circular sub-area 356 is positioned inside the innermost one of the concentric annular sub-areas 352. The innermost linking sub-area 358 is positioned to link the innermost one of the concentric annular sub-areas 352 and the circular sub-area 356. The second area 360 includes at least one sub-area 362. Each sub-area 362 of the second area 360 is positioned in a region between the adjacent concentric annular sub-areas 352 excluding the corresponding linking sub-area 354 of the first area 350. The second area 360 further includes another sub-area 362 positioned between the circular sub-area 356 and the innermost one of the concentric annular sub-areas 352 excluding the innermost linking sub-area 358. In summary, the second area 360 also has a plurality of concentric annular structures. The linking sub-areas 354 and the innermost linking sub-area 358 make each annular structure of the second area 360 be formed as a C-shape.

As mentioned above, the feature of the present invention is that the gate electrode layer 308 is formed to have the plurality of concentric annular structures. Accordingly, the first insulating layer 306 positioned below the gate electrode layer 308 and the second insulating layer 314 positioned above the gate electrode layer 308 are also formed to have the plurality of concentric annular structures. In summary, the first insulating layer 306, the gate electrode layer 308, and the second insulating layer 314 are sequentially formed on the first area 350 of the first electrode layer 304. The first insulating layer 306 and the second insulating layer 314 are made of at least one material selected from a group consisting of silicon oxide (SiOx), silicon nitride (SiNx), and $Al_2O_3$. The gate electrode layer 308 is made of aluminum or tantalum, for example.

The semiconductor layer 310 is formed on the second area 360 of the first electrode layer 304 and made of organic semiconductor material or inorganic semiconductor material. For example, the organic material includes pentacene, and the inorganic semiconductor material includes at least one selected from a group consisting of indium gallium zinc oxide (In—Ga—Zn—O), amorphous silicon (a-Si), single crystal silicon, and polycrystalline silicon.

It can be seen clearly from the top view diagram that the first area 350 for forming the first insulating layer 306, the gate electrode layer 308, the second insulating layer 314, and the second area 360 for forming the semiconductor layer 310 are interlaced from the innermost to the outermost. In the present embodiment, a top surface of the semiconductor layer 310 is higher than a top surface of the gate electrode layer 308. In another embodiment, the top surface of semiconductor layer 310 can be lower than the top surface of the gate electrode layer 308. It is noted that the number of the concentric annular structures is not limited. In the present embodiment, the first area 350 includes 4 concentric annular structures and the 4 concentric annular structures are linked together, and the second area 360 includes 3 C-shaped structures.

Figure 2:
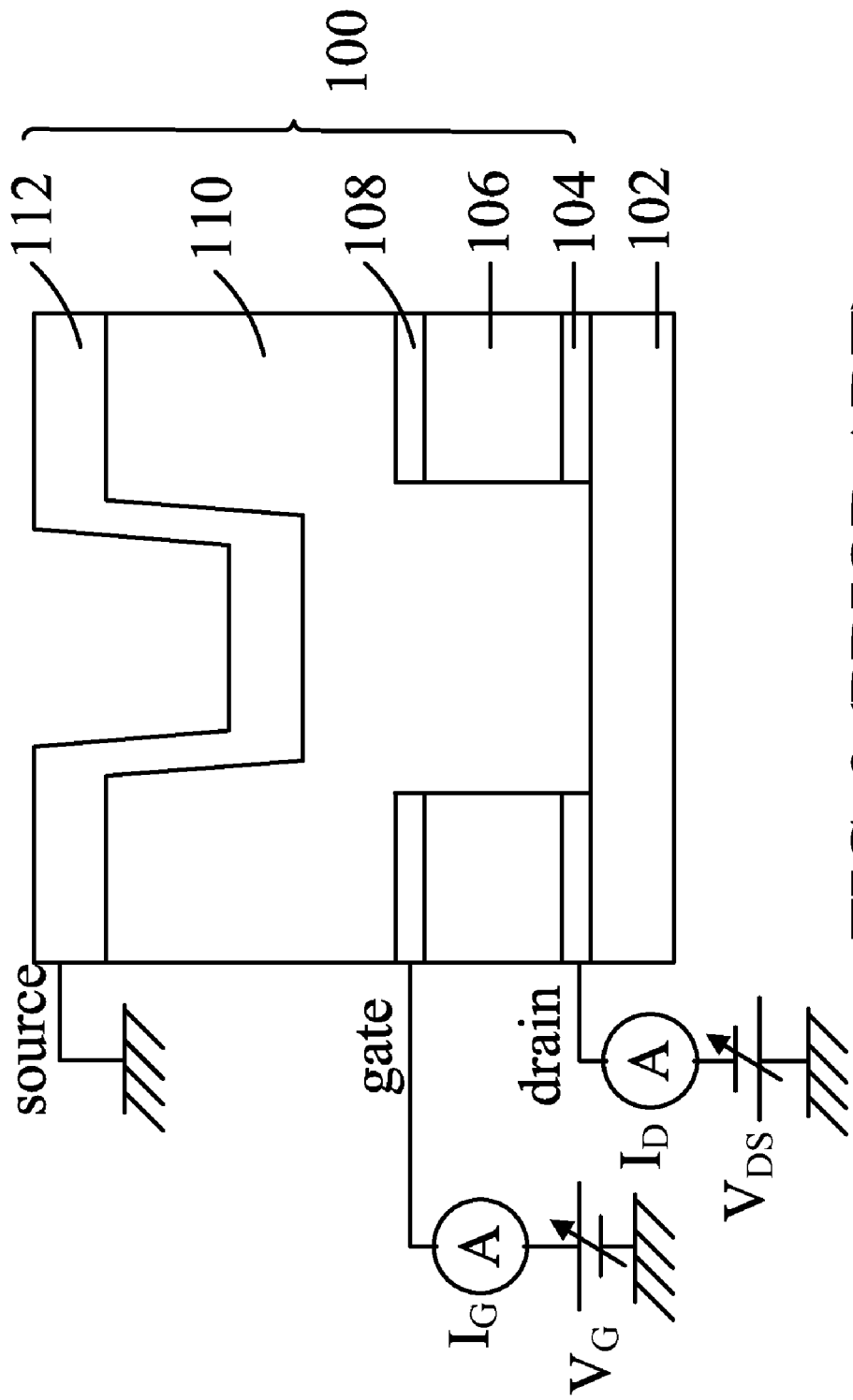
FIG. 2 illustrates a structure of the vertical thin film transistor and a driving circuit thereof in the above-mentioned paper.

The third insulating layer 316 is formed on side surfaces of the gate electrode layer 308 by oxidizing the side surfaces of the gate electrode layer 308 with chemical reactions (including electrochemical processes). For example, if the gate electrode layer 308 is made of aluminum, inner side surfaces and outer side surfaces of the gate electrode layer 308 are oxidized into $Al_2O_3$. If the gate electrode layer 308 is made of tantalum, inner side surfaces and outer side surfaces of the gate electrode layer 308 are oxidized into $Ta_2O_5$. As a result, the inner side surfaces and the outer side surfaces of the gate electrode layer 308 are densely covered and with high-k dielectric (high dielectric constant). Compared with the prior art in FIG. 2, in which the depletion region served as the insulating layer is only formed in the contact interface between the gate electrode layer 108 and the semiconductor 110, the third insulating layer 316 of the present invention is capable of increasing a range for applying a voltage to the gate electrode layer 308 and the ON/OFF current ratio.

Finally, the second electrode layer 312 is formed on the semiconductor layer 310 to cover at least the semiconductor layer 310. The second electrode layer 312 is made of at least one material selected from a group consisting of aurum, aluminum, and indium tin oxide. An outermost edge of the second electrode layer 312 is contracted inwardly with respect to an outermost edge of the gate electrode layer 308. This is to ensure that the second electrode layer 312 will not contact with the first electrode layer 304. If by any chance the second electrode layer 312 contacts with the first electrode layer 304, the vertical thin film transistor 300 will be turned on without applying a voltage. Such a situation can be avoided since the contact between the second electrode layer 312 and the first electrode layer 304 is prevented.

One of the first electrode layer 304 and the second electrode layer 312 is utilized as a source electrode, and the other one of the first electrode layer 304 and the second electrode layer 312 is correspondingly utilized as a drain electrode. That is, when the first electrode layer 304 is utilized as a drain electrode, the second electrode layer 312 is utilized as a source electrode. When the first electrode layer 304 is utilized as a source electrode, the second electrode layer 312 is utilized as a drain electrode.

It can be seen clearly from the side view diagram that the first electrode layer 304 is below the semiconductor layer 310, the second electrode layer 312 is above the semiconductor 310, and the gate layer 308 surrounds the semiconductor layer 310. That is, the semiconductor layer 310 is almost shielded and covered by metal materials. Only a little part of the semiconductor layer 310 is covered by the first insulating layer 306 and the second insulating layer 314. However, the side diagram is an enlargement of the vertical thin film transistor 300. In practice, almost all of the semiconductor layer 310 can be regarded as being shielded and covered by the metal materials in an actual size of the vertical thin film transistor 300. Therefore, the metal materials can protect the semiconductor layer 310 from affects of external electromagnetic waves or reduce such affects at least. Furthermore, when the second electrode layer 312 is made of non-transparent material, the second electrode layer 312 has a shielding function to prevent generation of an optical current. Accordingly, a high off-state current caused by the generation of the optical current can be decreased.

It can been understood form FIG. 3 that a channel length (L) is from a top surface of the first insulating layer 306 to a bottom surface of the second insulating layer 314. The channel length (L) represents a distance which current flows through. A channel width (W) includes a total circumference of the concentric annular sub-areas 352. The channel width (W) represents a region which the current flows through. Compared with the prior art, the channel width (W) of the present invention is increased a lot, and the on-state current is also increased accordingly.

Please refer to FIGS. 4A-4F. FIGS. 4A-4F illustrate steps of a flow chart of a method for manufacturing the vertical thin film transistor 300 according to one embodiment of the present invention. The method is applied to the substrate 302 shown in FIG. 4A. The substrate 302 includes a flexible substrate or a rigid substrate. The flexible substrate is made of polyethylene terephthalate (PET) or polyimide, for example. The rigid substrate is made of glass, for example.

In FIG. 4B, the first electrode layer 304 is formed on the substrate 300. For example, at least one material selected from a group consisting of aurum, aluminum, copper, chromium, molybdenum, tantalum, and indium tin oxide (ITO) is formed on the substrate 300 as the first electrode layer 304 by sputtering.

In FIG. 4C, a patterned photoresistor layer 340 is formed on the first electrode layer 304. For example, the patterned photoresistor layer 340 is formed by a lithography process. Please refer to the top view diagram of FIG. 3 and FIG. 4C, the patterned photoresistor layer 340 is patterned so as to make the first electrode layer 304 include the first area 350 and the second area 360. The second area 360 is covered by the patterned photoresistor layer 340, while the first area 350 is not covered by the patterned photoresistor layer 340. The first area 350 includes concentric annular sub-areas 352, the linking sub-areas 354, the circular sub-area 356, and the innermost linking sub-area 358. Each linking sub-area 354 is positioned to link the adjacent concentric annular sub-areas 352. The circular sub-area 356 is positioned inside the innermost one of the concentric annular sub-areas 352. The innermost linking sub-area 358 is positioned to link the innermost one of the concentric annular sub-areas 352 and the circular sub-area 356. The second area 360 has at least one sub-area 362, and each sub-area 362 of the second area 360 is positioned in a region between the adjacent concentric annular sub-areas 352 excluding the linking sub-area 358 of the first area 350. The second area 360 further includes another sub-area 362 positioned in another region between the circular sub-area 356 and the innermost one of the concentric annular sub-areas 352 excluding the innermost linking sub-area 358 of the first area 350. That is, the second area 360 in FIG. 3 is corresponding to positions which are covered by the patterned photoresistor layer 340 in FIG. 4C, while the first area 350 in FIG. 3 is corresponding to positions which are not covered by the patterned photoresistor layer 340 in FIG. 4C.

In FIG. 4D, the first insulating layer 306 is formed on the first electrode 304 where the patterned photoresistor layer 340 does not cover (i.e. the first area 350 in FIG. 3). Then, the gate layer 308 is formed correspondingly on the first insulating layer 306, and a second insulating layer 314 is formed correspondingly on the gate electrode layer 308. For example, the first insulating layer 306, the gate electrode layer 308, and the second insulating layer 314 are formed sequentially on the first electrode 304 where the patterned photoresistor layer 340 doe not cover (i.e. the first area 350 in FIG. 3) by sputtering. The first insulating layer 306 and the second insulating layer 314 are made of at least one material selected from a group consisting of silicon oxide (SiOx), silicon nitride (SiNx), and $Al_2O_3$, for example. The gate electrode layer 308 is made of aluminum or tantalum, for example. Then, the patterned photoresistor layer 340 is removed, and the third insulting layer 316 is formed on side surfaces of the gate electrode layer 308. For example, the third insulating layer 316 is formed on side surfaces of the gate electrode layer 308 by an electrochemical method or by oxidizing the side surfaces of the gate electrode layer 308 with an oxygen plasma treatment. The side surfaces of the gate electrode layer 308 include inner side surfaces and outer side surfaces. The third insulating layer includes $Al_2O_3$ or $Ta_2O_5$.

In FIG. 4E, the semiconductor layer 310 is formed on where the patterned photoresistor layer 340 has been removed (i.e. the second area 360 in FIG. 3). The top surface of the semiconductor layer 310 can be higher or lower than the top surface of the gate electrode layer 308. For example, organic semiconductor material or inorganic semiconductor material is formed on where the patterned photoresistor layer 340 has been removed (i.e. the second area 360 in FIG. 3).

In FIG. 4F, the second electrode layer 312 is formed on the semiconductor layer 310 to cover at least the semiconductor layer 310. For example, at least one material selected from a group consisting of aurum, aluminum, and indium tin oxide is formed on the semiconductor layer 310. The outermost edge of the second electrode layer 312 is contracted inwardly with respect to the outermost edge of the gate electrode layer 308. This is to ensure that the second electrode layer 312 will not contact with the first electrode layer 304. If by any chance the second electrode layer 312 contacts with the first electrode layer 304, the vertical thin film transistor 300 will be turned on without applying a voltage. Such a situation can be avoided since the contact between the second electrode layer 312 and the first electrode layer 304 is prevented. In one embodiment, when the semiconductor layer 310 is made of indium gallium zinc oxide (In—Ga—Zn—O), an ohm contact of the vertical thin film transistor 300 can be increased by sputtering Argon.

Figure 5A:
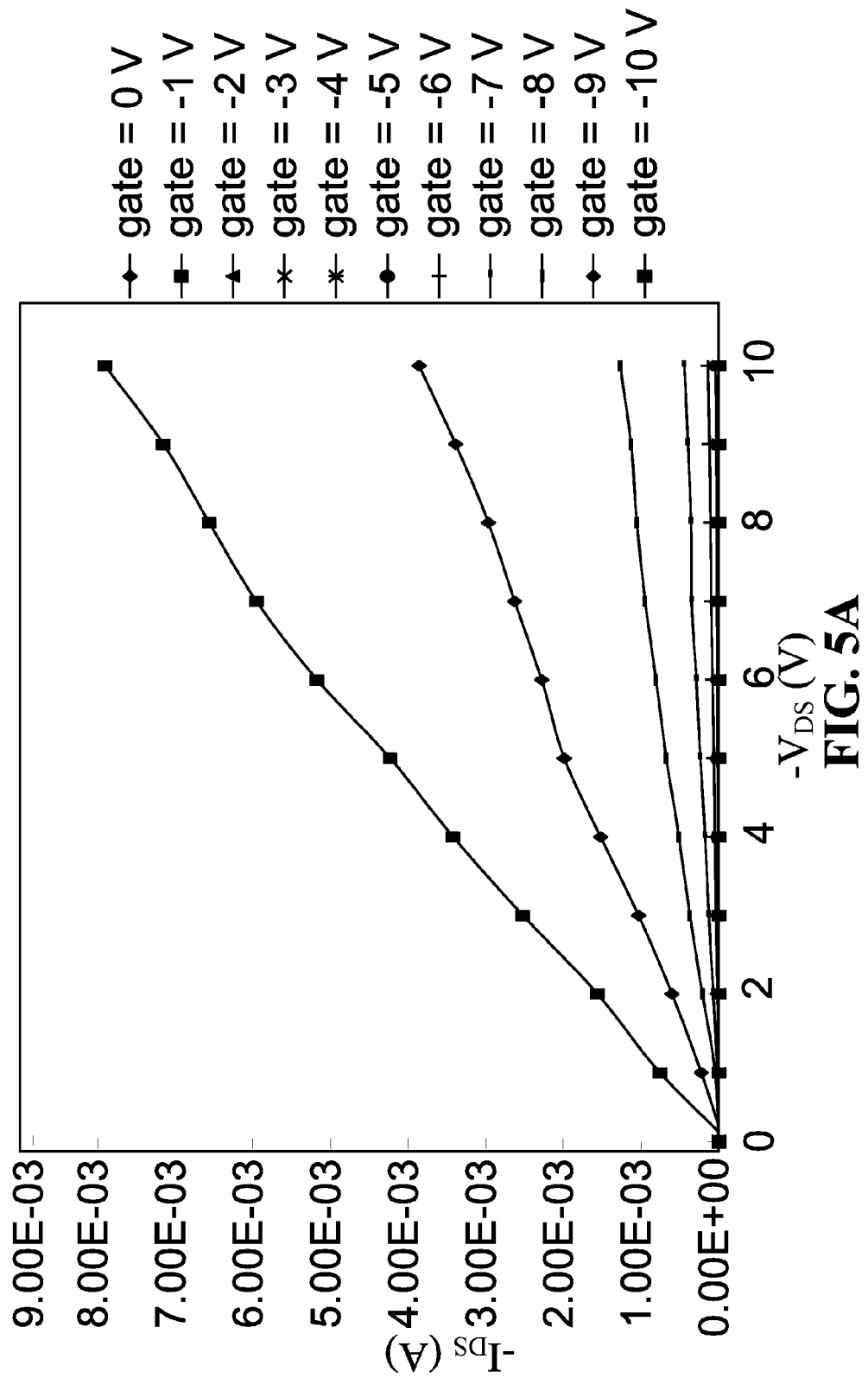
FIGS. 5A-5B illustrate current-voltage (I-V) curves according to the vertical thin film transistor of the present invention, in which the semiconductor layer is formed by pentacene.
Figure 5B:
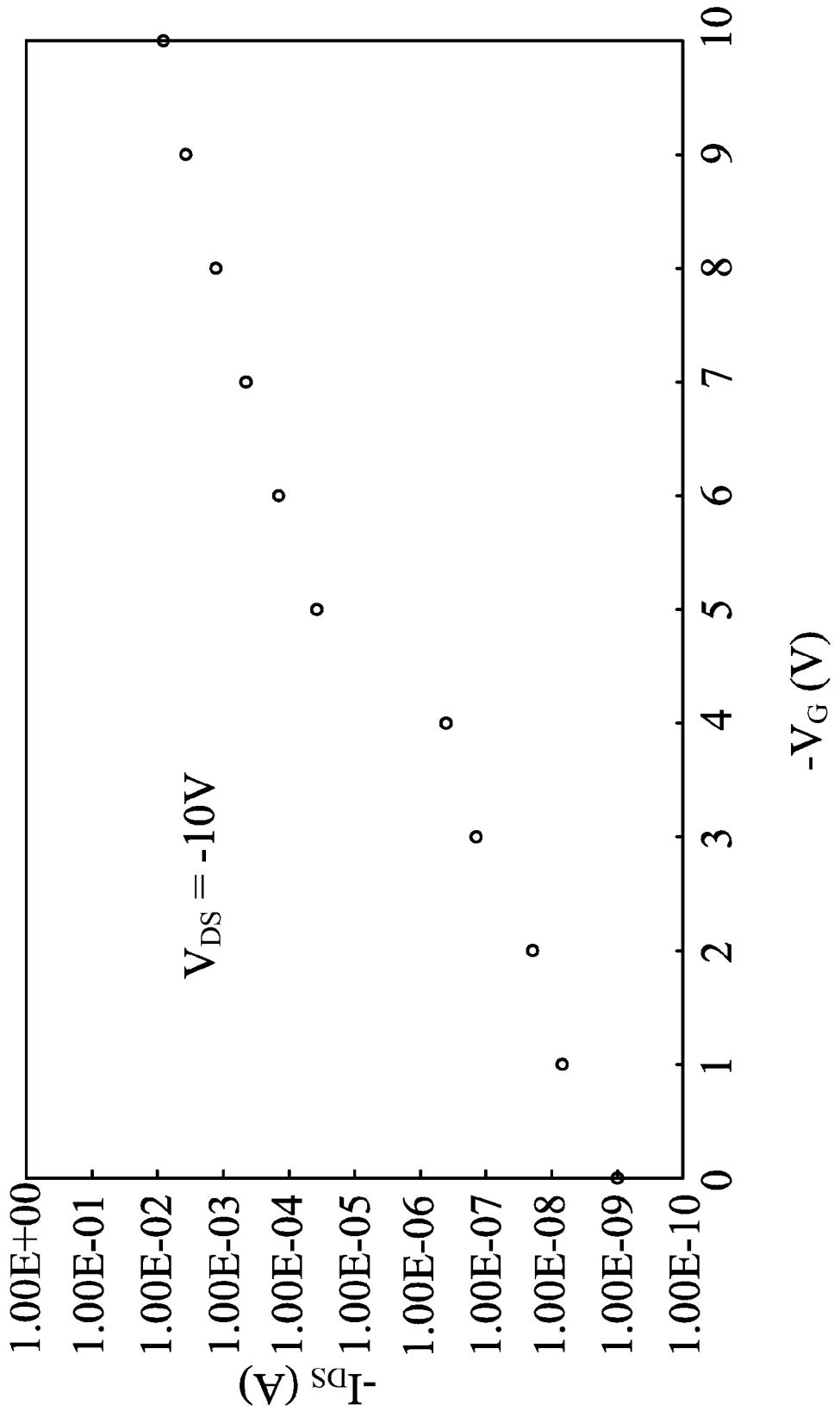

Please refer to FIGS. 5A-5B. FIGS. 5A-5B illustrate current-voltage (I-V) curves according to the vertical thin film transistor of the present invention, in which the semiconductor layer is formed by pentacene. FIG. 5A illustrates $I_{DS}$-$V_{DS}$ curves under different $V_G$ (gate voltage of the vertical thin film transistor). In FIG. 5A, when $V_G$ (gate voltage of the vertical thin film transistor) is equal to −10V (very low), $I_{DS}$ can reach $8*10^{-3}$ A which is higher than prior art. FIG. 5B illustrates an $I_{DS}$-$V_G$ curve when $V_{DS}$ is equal to −10V. In FIG. 5B, an ON/OFF current ratio is $=(1*10^{-2}/1*10^{-9}$ A$)=10^7$. This value is also better than prior art.

Figure 6:
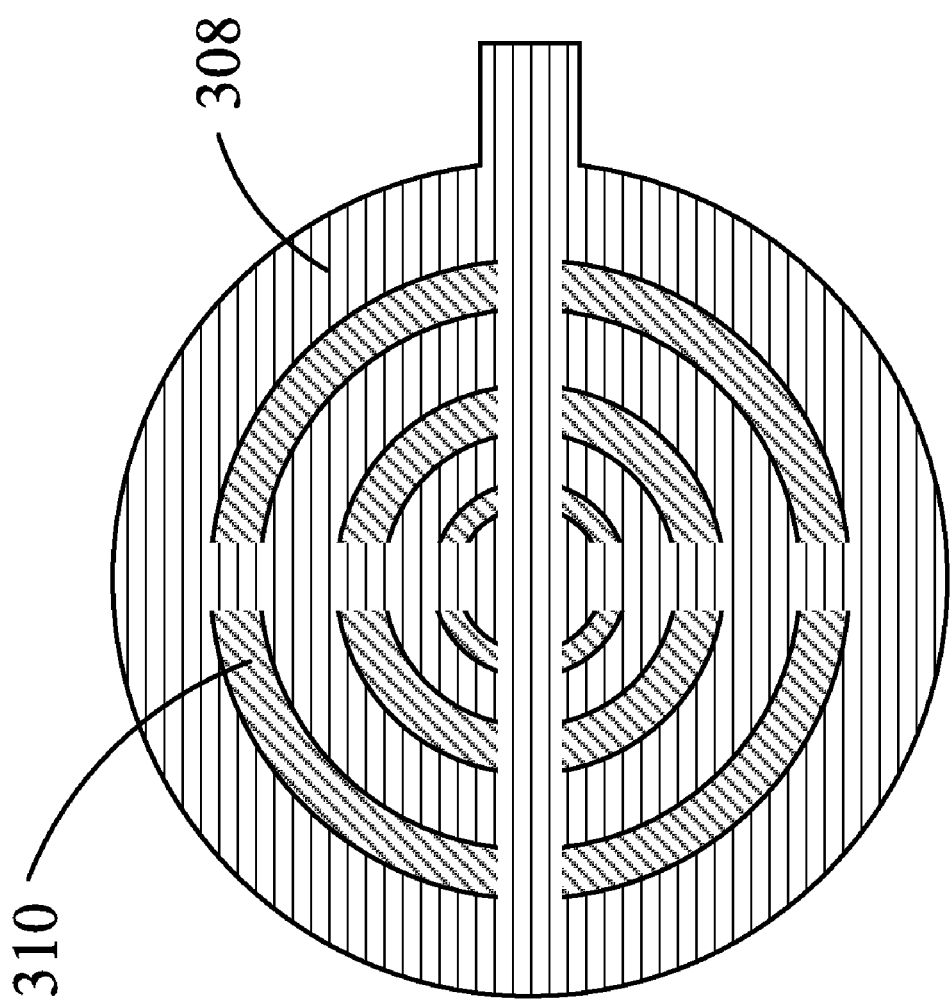
FIG. 6 illustrates a top view diagram of the gate electrode layer 308 and the semiconductor layer 310 according to another embodiment of the present invention.

The gate electrode layer 308 of the present invention is formed to have the plurality of concentric annular structures, and each one of the plurality of concentric annular structures is linked together. Please refer to FIG. 6. FIG. 6 illustrates a top view diagram of the gate electrode layer 308 and the semiconductor layer 310 according to another embodiment of the present invention. The gate electrode layer 308 is still formed to have the plurality of concentric annular structures, and a link of the concentric annular structures is a crisscross. As a result, the first insulating layer 306 (as shown in FIG. 3) below the gate electrode layer 308 and the second insulating layer 314 (as shown in FIG. 3) above the gate electrode layer 308 have the same structures as the gate electrode layer 308. The structures of the semiconductor layer 310 in FIG. 6 are different from the structures of the semiconductor layer 310 in FIG. 3. The structures in FIG. 6 are divided into 4 fan-shaped areas by the crisscross. The structures of the present embodiment are capable of enhancing flexibility, so as to prevent positions which the gate electrode layer 308 does not protect from being broken.

The gate layer of the present invention is formed to have the plurality of concentric annular structures so that resistance to stress of the vertical thin film transistor can be increased. The on-state current is also increased due to the increasing of the channel width (W) of the vertical thin film transistor. In addition, the semiconductor layer is almost shielded and covered by metal layers which comprise the first electrode layer, the gate layer, and the second electrode layer. Therefore, the metal layers can protect the semiconductor layer from affects of external electromagnetic waves or reduce such affects at least, and they also can decrease the high off-state current. Finally, the formation of the third insulating layer can increase a range for applying a voltage to the gate electrode layer and the ON/OFF current ratio of the vertical thin film transistor.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A vertical thin film transistor, applied to a substrate, the vertical thin film transistor comprising:
   a first electrode layer, formed on the substrate, the first electrode layer comprising a first area and a second area, the first area comprising a plurality of concentric annular sub-areas and at least one linking sub-area, each linking sub-area being positioned to link the adjacent concentric annular sub-areas, the second area including at least one sub-area, each sub-area of the second area being positioned in a region between the adjacent concentric annular sub-areas excluding the linking sub-area of the first area, the first area further comprising a circular sub-area positioned inside the innermost one of the concentric annular sub-areas and an innermost linking sub-area positioned to link the innermost one of the concentric annular sub-areas and the circular sub-area, and the second area further including another sub-area positioned in another region between the circular sub-area and the innermost one of the concentric annular sub-areas excluding the innermost linking sub-area of the first area;
   a first insulating layer, formed on the first area of the first electrode layer;
   a gate electrode layer, formed correspondingly on the first insulating layer;
   a second insulating layer, formed correspondingly on the gate electrode layer;
   a semiconductor layer, formed on the second area of the first electrode layer;
   a third insulating layer, formed on side surfaces of the gate electrode layer; and
   a second electrode layer, formed on the semiconductor layer.

2. The vertical thin film transistor of claim 1, wherein a top surface of the semiconductor layer is higher or lower than a top surface of the gate electrode layer.

3. The vertical thin film transistor of claim 1, wherein an outermost edge of the second electrode layer is contracted inwardly with respect to an outermost edge of the gate electrode layer.

4. The vertical thin film transistor of claim 1, wherein the substrate comprises a flexible substrate or a rigid substrate.

5. The vertical thin film transistor of claim 4, wherein the flexible substrate is made of polyethylene terephthalate or polyimide.

6. The vertical thin film transistor of claim 4, wherein the rigid substrate is made of glass.

7. The vertical thin film transistor of claim 1, wherein the first electrode layer is made of at least one material selected from a group consisting of aurum, aluminum, copper, chromium, molybdenum, tantalum, and indium tin oxide.

8. The vertical thin film transistor of claim 1, wherein the semiconductor layer is made of organic semiconductor material or inorganic semiconductor material.

9. The vertical thin film transistor of claim 8, wherein the organic semiconductor material comprises pentacene.

10. The vertical thin film transistor of claim 8, wherein the inorganic semiconductor material comprises at least one selected from a group consisting of indium gallium zinc oxide, amorphous silicon, single crystal silicon, and polycrystalline silicon.

11. The vertical thin film transistor of claim 10, wherein the first insulating layer is made of at least one material selected from a group consisting of silicon oxide, silicon nitride, and $Al_2O_3$.

12. The vertical thin film transistor of claim 1, wherein the gate electrode layer is made of aluminum or tantalum.

13. The vertical thin film transistor of claim 1, wherein the second insulating layer is made of at least one material selected from a group consisting of silicon oxide, silicon nitride, and $Al_2O_3$.

14. The vertical thin film transistor of claim 1, wherein the second electrode layer is made of at least one material selected from a group consisting of aurum, aluminum, and indium tin oxide.

15. The vertical thin film transistor of claim 1, wherein the third insulating layer comprises $Al_2O_3$ or $Ta_2O_5$.

16. The vertical thin film transistor of claim 1, wherein one of the first electrode layer and the second electrode layer is utilized as a source electrode, and the other one of the first electrode layer and the second electrode layer is utilized as a drain electrode.

17. A display device comprising the vertical thin film transistor of claim 1.

* * * * *